(12) United States Patent
Matsudai et al.

(10) Patent No.: US 9,496,352 B2
(45) Date of Patent: Nov. 15, 2016

(54) SEMICONDUCTOR DEVICE

(71) Applicant: Kabushiki Kaisha Toshiba, Minato-ku, Tokyo (JP)

(72) Inventors: Tomoko Matsudai, Shibuya Tokyo (JP); Norio Yasuhara, Kawasaki Kanagawa (JP); Tsuneo Ogura, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/843,640

(22) Filed: Sep. 2, 2015

(65) Prior Publication Data

US 2016/0276444 A1  Sep. 22, 2016

(30) Foreign Application Priority Data

Mar. 16, 2015  (JP) ................. 2015-052409

(51) Int. Cl.
*H01L 29/74* (2006.01)
*H01L 31/111* (2006.01)
*H01L 29/36* (2006.01)
*H01L 29/739* (2006.01)

(52) U.S. Cl.
CPC .......... *H01L 29/36* (2013.01); *H01L 29/7395* (2013.01)

(58) Field of Classification Search
CPC ............... H01L 29/7395; H01L 29/36; H01L 29/7816; H01L 29/7827
USPC ........................ 257/133, 139, 655
See application file for complete search history.

(56) References Cited

U.S. PATENT DOCUMENTS

| 6,064,086 | A | 5/2000 | Nakagawa et al. |
| 7,772,641 | B2 | 8/2010 | Omura et al. |
| 8,008,715 | B2* | 8/2011 | Kawaguchi ......... H01L 29/7811 257/331 |
| 8,390,097 | B2 | 3/2013 | Hamaguchi et al. |
| 9,029,918 | B2 | 5/2015 | Ogura |
| 2006/0151828 | A1* | 7/2006 | Takemori ............ H01L 29/7813 257/327 |
| 2007/0210350 | A1 | 9/2007 | Omura et al. |
| 2012/0061724 | A1 | 3/2012 | Ogura |
| 2014/0374791 | A1 | 12/2014 | Matsudai et al. |
| 2015/0221736 | A1 | 8/2015 | Ogura |

FOREIGN PATENT DOCUMENTS

JP  H04-216633 A  8/1992

* cited by examiner

*Primary Examiner* — Theresa T Doan
(74) *Attorney, Agent, or Firm* — White & Case LLP

(57) ABSTRACT

According to one embodiment, a semiconductor device includes: a first semiconductor region; a second semiconductor region on the first semiconductor region; a third semiconductor region on the second semiconductor region; an fourth insulating film on the second semiconductor region and the third semiconductor region; a first electrode under the first semiconductor region; a second electrode on the fourth insulating film; a plurality of first contact regions extending in a first direction from the first electrode toward the second electrode in the fourth insulating film, and the plurality of first contact regions electrically connecting the third semiconductor region to the second electrode; a plurality of second contact regions extending in the first direction in the fourth insulating film, and one of the plurality of second contact regions between adjacent ones of the first contact regions; and a third electrode in the second semiconductor region via a first insulating film.

20 Claims, 12 Drawing Sheets

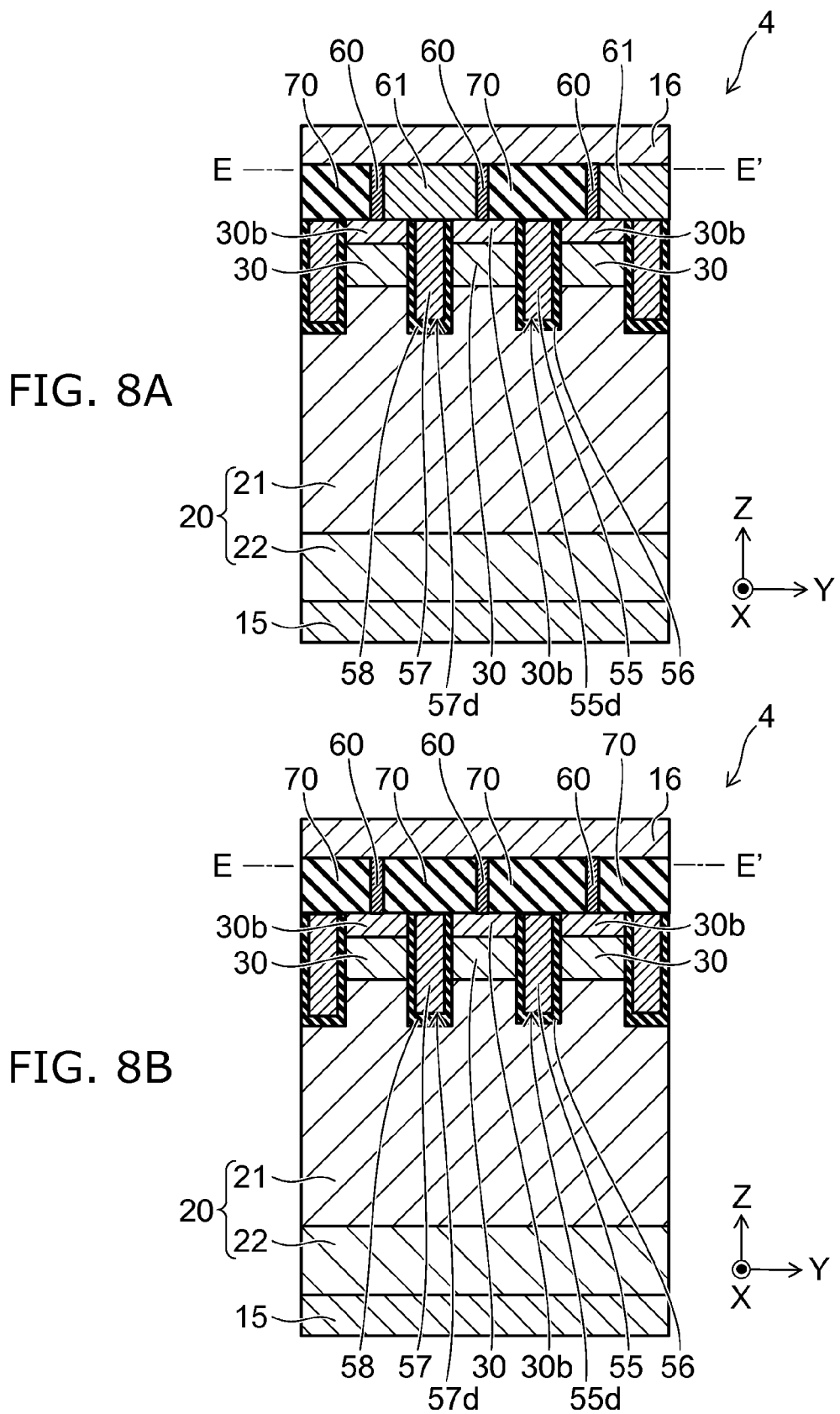

SEMICONDUCTOR DEVICE

CROSS-REFERENCE TO RELATED APPLICATIONS

This application is based upon and claims the benefit of priority from Japanese Patent Application No. 2015-052409, filed on Mar. 16, 2015; the entire contents of which are incorporated herein by reference.

FIELD

Embodiments described herein relate generally to a semiconductor device.

BACKGROUND

In semiconductor devices such as IGBTs (Insulated Gate Bipolar Transistors), there is a structure in which an interlayer insulating film is provided on a semiconductor layer and an emitter electrode is provided on the interlayer insulating film. The emitter electrode and a semiconductor region are electrically connected via a contact region including metal and piercing through the interlayer insulating film.

However, when the volume of the contact region piercing through the interlayer insulating film is small, the volume of the interlayer insulating film on the semiconductor region relatively increases. Here, the thermal resistance of the interlayer insulating film is high compared to that of metal constituting the emitter electrode and the contact region.

Hence, when the volume of the interlayer insulating film on the semiconductor layer is large and the volume of the contact region is small, heat generated in the semiconductor layer is less likely to dissipate to the emitter electrode side. Hence, in the semiconductor layer, a breakdown due to heat, a device breakdown that the emitter electrode above the semiconductor layer melts, or the like may occur.

BRIEF DESCRIPTION OF THE DRAWINGS

FIG. 8A to FIG. 9B are schematic cross-sectional views showing a main portion of a semiconductor device according to a fourth embodiment;

DETAILED DESCRIPTION

Figure 1A:
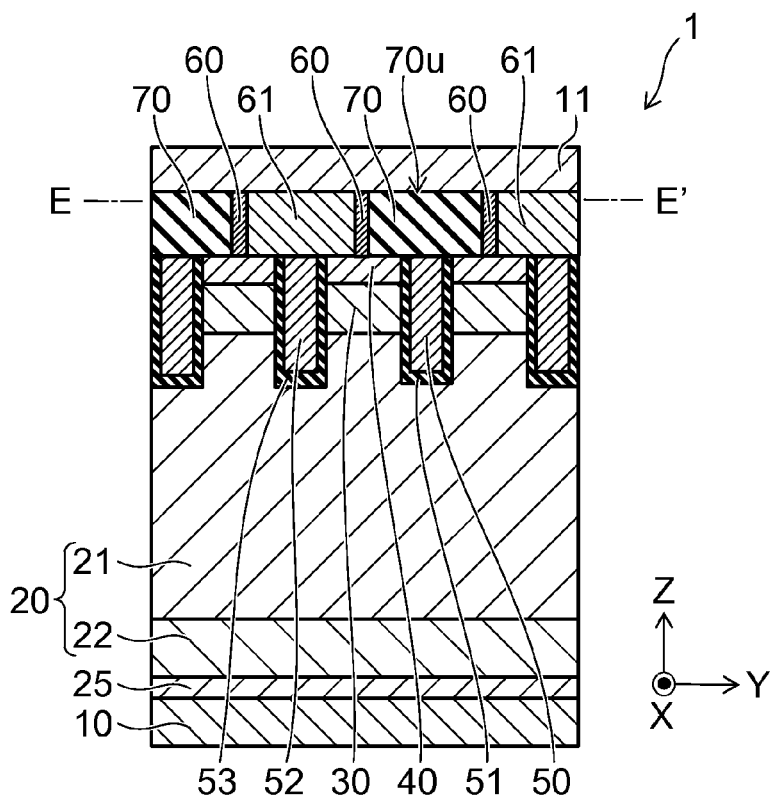
FIG. 1A to FIG. 2B are schematic cross-sectional views showing a main portion of a semiconductor device according to a first embodiment.

According to one embodiment, a semiconductor device includes: a first semiconductor region of a first conductivity type; a second semiconductor region of a second conductivity type; a third semiconductor region of a first conductivity type; a fourth insulating film; a first electrode; a second electrode; a plurality of first contact regions; a plurality of second contact regions; and a third electrode. The second semiconductor region is provided on the first semiconductor region. The third semiconductor region is provided on the second semiconductor region. The fourth insulating film is provided on the second semiconductor region and on the third semiconductor region. The first electrode is provided under the first semiconductor region. The second electrode is provided on the fourth insulating film. The plurality of first contact regions extend in a first direction directed from the first electrode toward the second electrode in the fourth insulating film, and the plurality of first contact regions electrically connect the third semiconductor region to the second electrode. The plurality of second contact regions extend in the first direction in the fourth insulating film, and one of the plurality of second contact regions is provided between adjacent ones of the first contact regions. And the third electrode is provided in the second semiconductor region via a first insulating film.

Hereinafter, embodiments will be described with reference to the drawings. In the following description, the same members are denoted by the same reference numerals, and the description of the members once described is omitted as appropriate. In the embodiments, $n^+$-type, n-type, and $n^-$-type show that the n-type (first-conductivity-type) impurity concentration decreases in that order. Moreover, $p^+$-type, p-type, and $p^-$-type show that the p-type (second-conductivity-type) impurity concentration decreases in that order.

First Embodiment

FIG. 1A to FIG. 2B are schematic cross-sectional views each showing a main portion of a semiconductor device according to the first embodiment.

Figure 3:
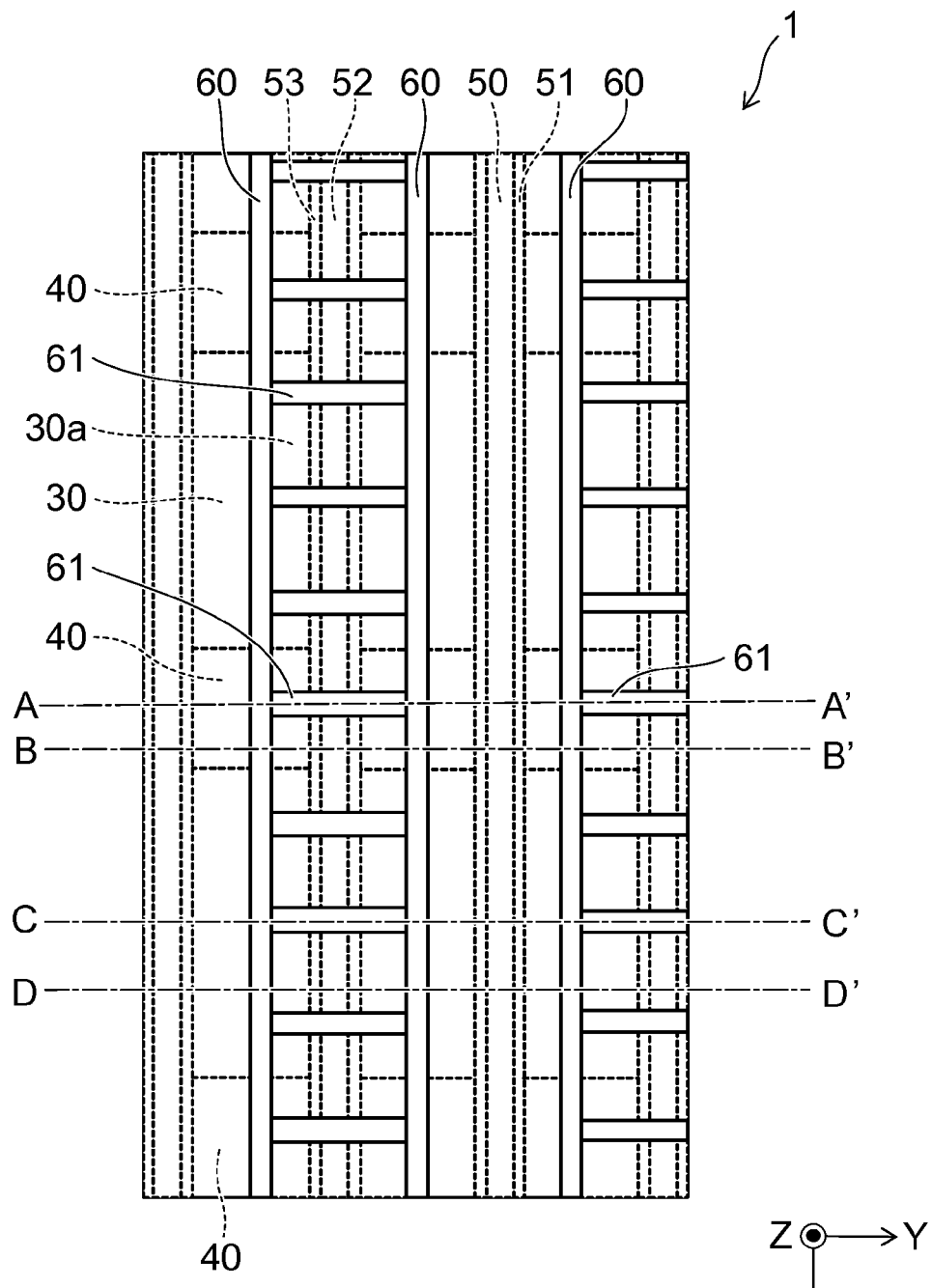
FIG. 3 is a schematic plan view showing a main portion of the semiconductor device according to the first embodiment.

FIG. 3 is a schematic plan view showing a main portion of the semiconductor device according to the first embodiment.

Figure 1B:
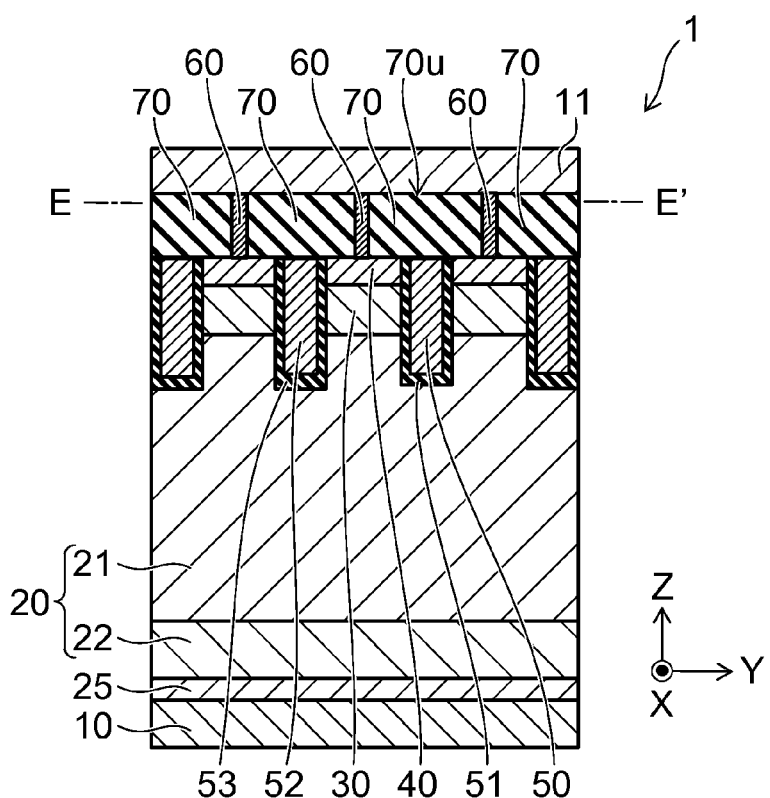
Figure 2A:
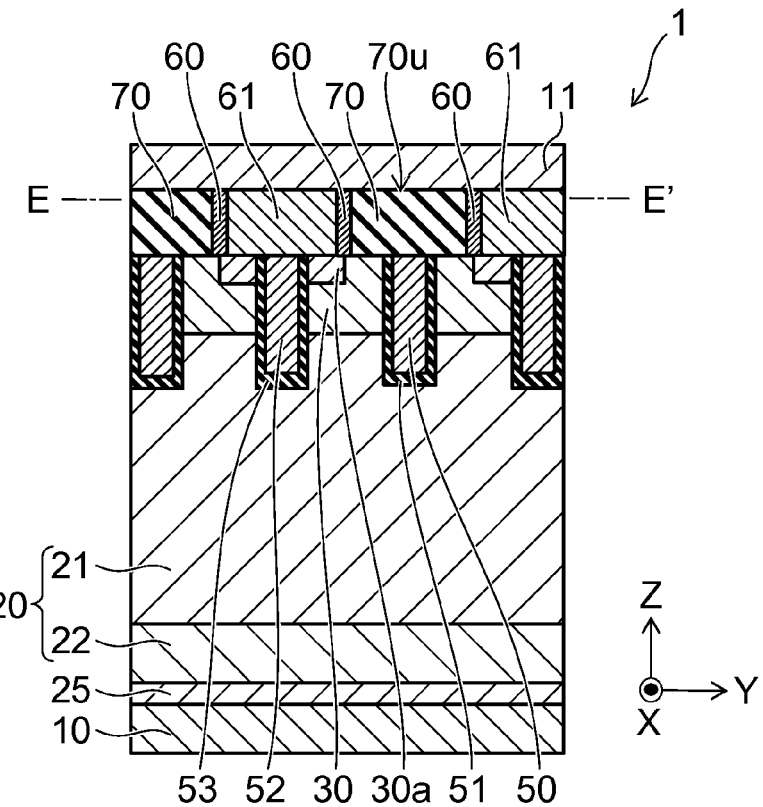
Figure 2B:
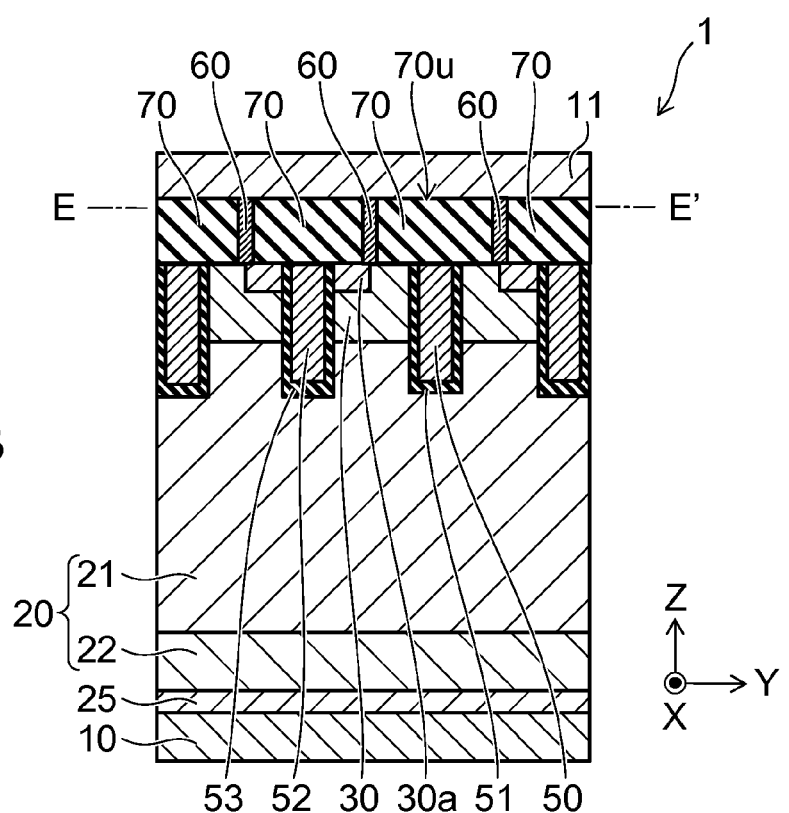

FIG. 1A shows a cross-section along the line A-A' in FIG. 3; FIG. 1B shows a cross-section along the line B-B' in FIG. 3; FIG. 2A shows a cross-section along the line C-C' in FIG. 3; and FIG. 2B shows a cross-section along the line D-D' in FIG. 3.

FIG. 3 shows a plane along the line E-E' in FIG. 1A to FIG. 2B. In FIG. 3, an interlayer insulating film 70 shown in FIG. 1A to FIG. 2B is not shown.

As shown in FIG. 1A to FIG. 2B and FIG. 3, the semiconductor device 1 according to the first embodiment includes a first semiconductor region (hereinafter referred to as, for example, a semiconductor region 20), a second semiconductor region (hereinafter referred to as, for example, a p-type base region 30), a third semiconductor region (hereinafter referred to as, for example, an $n^+$-type emitter region 40), a fourth semiconductor region (hereinafter referred to as, for example, a $p^+$-type collector region 25), a fourth insulating film (hereinafter referred to as, example, an interlayer insulating film 70), a first electrode (hereinafter referred to as, for example, a collector electrode 10), a second electrode (hereinafter referred to as, for example, an emitter electrode 11), a third electrode (hereinafter referred to as, for example, a gate electrode 50), a first insulating film (hereinafter referred to as, for example, a gate insulating film 51), a fourth electrode (hereinafter referred to as, for example, an electrode 52), a second insulating film (hereinafter referred to as, for example, an insulating film 53), a first contact region (hereinafter referred to as, for example, a contact region 60), and a second contact region (hereinafter referred to as, for example, a contact region 61).

The semiconductor region 20 includes an n-type buffer region 22 and an n⁻-type base region 21 provided on the n-type buffer region 22.

The semiconductor device 1 illustrated in FIG. 1A to FIG. 2B and FIG. 3 is a vertical IGBT having a vertical electrode structure. When the p⁺-type collector region 25 is removed from the semiconductor device 1, an n⁺-type drain region is provided instead of the p⁺-type collector region 25, and the n⁺-type drain region is brought into direct contact with the collector electrode 10, the semiconductor device 1 is a vertical MOSFET having a vertical electrode structure. The embodiment includes the case where the semiconductor device 1 is the MOSFET. When the semiconductor device 1 is the MOSFET, the emitter is replaced with a source, and the collector is replaced with a drain.

In the embodiment, a direction directed from the collector electrode 10 to the emitter electrode 11 is defined as a first direction (hereinafter referred to as a Z-direction), a direction that crosses the Z-direction and in which the gate electrode 50 extends is defined as a second direction (hereinafter referred to as an X-direction), and a direction that crosses the Z-direction and the X-direction and in which a plurality of the gate electrodes 50 are arranged in parallel is defined as a third direction (hereinafter referred to as a Y-direction).

A plurality of the p-type base regions 30 are selectively provided on the semiconductor region 20 (FIG. 1A to FIG. 2B). The plurality of p-type base regions 30 extend in the X-direction and are arranged in the Y-direction (FIG. 3). The impurity concentration (the maximum or average value of an impurity concentration profile in the Z-direction) of a p⁺-type region 30a as a portion of the p-type base region 30 is relatively high with respect to the impurity concentration of the p-type base region 30.

A plurality of the n⁺-type emitter regions 40 are respectively provided on the plurality of p-type base regions 30 (FIG. 1A to FIG. 2B). The plurality of n⁺-type emitter regions 40 are selectively provided on the surfaces of the p-type base regions 30. The plurality of n⁺-type emitter regions 40 are arranged in the X-direction and also arranged in the Y-direction (FIG. 3). For example, the p-type base region 30 and the p⁺-type region 30a, and the n⁺-type emitter region 40 are alternately provided in the X-direction.

The collector electrode 10 is provided under the semiconductor region 20. The p⁺-type collector region 25 is provided between the semiconductor region 20 and the collector electrode 10 (FIG. 1A to FIG. 2B). The collector electrode 10 is electrically connected to the p⁺-type collector region 25. The emitter electrode 11 is provided on the interlayer insulating film 70. The interlayer insulating film 70 is provided on the plurality of gate electrodes 50, a plurality of the gate insulating films 51, a plurality of the electrodes 52, a plurality of the insulating films 53, the plurality of p-type base regions 30, a plurality of the p⁺-type regions 30a, and the plurality of n⁺-type emitter regions 40.

An upper surface 70u of the interlayer insulating film 70 is, for example, planarized by a CMP (Chemical Mechanical Polishing) process or the like.

A plurality of the contact regions 60 electrically connect the plurality of n⁺-type emitter regions 40 to the emitter electrode 11 (FIGS. 1A and 1B). For example, one of the plurality of n⁺-type emitter regions 40 and the emitter electrode 11 are electrically connected by means of one of the plurality of contact regions 60. The plurality of contact regions 60 are in contact with the plurality of n⁺-type emitter regions 40, and are also in contact with the plurality of p-type base regions 30 and the p⁺-type regions 30a (FIGS. 2A and 2B). The plurality of contact regions 60 pierce the interlayer insulating film 70 in the Z-direction. The plurality of contact regions 60 are in contact with the interlayer insulating film 70 in the Y-direction.

The plurality of contact regions 60 extend in the interlayer insulating film 70. For example, the plurality of contact regions 60 extend in the Z-direction in cross-sectional planes in the Y-Z planes shown in FIG. 1A to FIG. 2B. The plurality of contact regions 60 extend in the X-direction in a cross-sectional plane in the X-Y plane shown in FIG. 3. Moreover, the plurality of contact regions 60 are arranged in the Y-direction.

A plurality of the contact regions 61 are provided between adjacent ones of the contact regions 60 in the Y-direction. Adjacent ones of the contact regions 60 are electrically connected to each other by means of the plurality of contact regions 61. One of the plurality of contact regions 61 is in contact with the plurality of n⁺-type emitter regions 40 and the emitter electrode 11 (FIG. 1A and FIG. 2A). The contact region 61 and the contact region 60 contiguous to each other may be configured of the same electrode material.

The plurality of contact regions 61 other than the one of the plurality of contact regions 61 are in contact with the plurality of p-type base regions 30 and the emitter electrode 11 (FIG. 1B and FIG. 2B). For example, the plurality of contact regions 61 other than the one of the plurality of contact regions 61 are in contact with the p⁺-type region 30a in the p-type base region 30. The plurality of contact regions 61 extend in the interlayer insulating film 70. For example, the plurality of contact regions 61 extend in the Z-direction and pierce the interlayer insulating film 70 in the Z-direction. The plurality of contact regions 61 are in contact with the interlayer insulating film 70. One of the plurality of contact regions 61 is provided on the n⁺-type emitter region 40 and the insulating film 51 which are provided between a pair of the gate electrode 50 in the Y-direction.

The plurality of contact regions 61 are arranged, for example, substantially periodically in the X-direction. For example, the plurality of contact regions 61 are arranged at substantially equal intervals in the X-direction.

In the cross-sectional plane in the X-Y plane shown in FIG. 3, the plurality of contact regions 61 extend in the Y-direction.

The gate electrode 50 is provided in the semiconductor region 20, one of the plurality of p-type base regions 30, and one of the plurality of n⁺-type emitter regions 40 via the gate insulating film 51 (FIG. 1A to FIG. 2B). The gate electrode 50 is opposed to the semiconductor region 20, one of the plurality of p-type base regions 30, and one of the plurality of n⁺-type emitter regions 40 via the gate insulating film 51. The plurality of gate electrodes 50 are provided. The plurality of gate electrodes 50 extend in the X-direction. The plurality of gate electrodes 50 are arranged in the Y-direction (FIG. 3). Each of the plurality of gate electrodes 50 is opposed, via the gate insulating film 51, to the p-type base region 30 provided between adjacent ones of the n⁺-type emitter regions 40 in the X-direction.

The electrode 52 is provided in the semiconductor region 20, one of the plurality of p-type base regions 30, and one of the plurality of n⁺-type emitter regions 40 via the insulating film 53 (FIG. 1A to FIG. 2B). For example, the electrode 52 is opposed to the semiconductor region 20, one of the plurality of p-type base regions 30, and one of the plurality of n⁺-type emitter regions 40 via the insulating film 53. The plurality of electrodes 52 are provided. The plurality of electrodes 52 extend in the X-direction (FIG. 3). The electrode 52 is provided beside the gate electrode 50 in the Y-direction. The plurality of electrodes 52 are arranged in the Y-direction. The gate electrode 50 and the electrode 52 are alternately arranged in the Y-direction. The electrode 52 is in contact with the contact region 61. The electrode 52 is electrically connected to the emitter electrode 11 via the contact regions 60 and 61. The potential of the electrode 52 is the same as the potential of the emitter electrode 11. Each of the plurality of electrodes 52 is opposed, via the insulating film 53, to the p-type base region 30 provided between adjacent ones of the n⁺-type emitter regions 40 in the X-direction.

Electrodes collectively including the gate electrodes 50 and the electrodes 52 are provided at, for example, equal intervals in the Y-direction. In this case, the pitch of the electrodes including the gate electrodes 50 and the electrodes 52 in the Y-direction (specifically, a distance between the center of the gate electrode 50 in the Y-direction and the center of the electrode 52 in the Y-direction) is from 0.5 μm to 6 μm. Moreover, a distance between adjacent ones of the electrodes in the Y-direction (specifically, a gap between a boundary portion between the insulating film 53 and the p-type base region 30 and a boundary portion between the gate insulating film 51 and the p-type base region 30) is, for example, from 0.2 μm to 5 μm. The width of the contact region 60 in the Y-direction is from 0.1 μm to 0.5 μm. The width of the contact region 61 in the X-direction is from 0.1 μm to 0.5 μm. The thickness of the interlayer insulating film 70 is, for example, from 1 μm to 10 μm.

The main component of each of the semiconductor region 20, the p-type base region 30, and the n⁺-type emitter region 40 is, for example, silicon (Si). The main component of each of the semiconductor region 20, the p-type base region 30, and the n⁺-type emitter region 40 may be silicon carbide (SiC), gallium nitride (GaN), or the like. The material of the insulating film and the interlayer insulating film includes, for example, silicon oxide ($SiO_x$) and silicon nitride ($SiN_x$).

The material of the collector electrode 10 or the emitter electrode 11 is, for example, metal including at least one selected from the group of aluminum (Al), titanium (Ti), nickel (Ni), tungsten (W), copper (Cu), gold (Au), and the like.

The material of the contact regions 60 and 61 is, for example, metal including at least one selected from the group of tungsten (W), aluminum (Al), nickel (Ni), gold (Au), titanium (Ti), copper (Cu), and the like, or polysilicon. The material of the gate electrode 50 and the electrode 52 includes, for example, polysilicon.

For example, phosphorus (P), arsenic (As), or the like is applied as an impurity element of the conductivity type of n⁺-type, n-type, or the like. For example, boron (B), aluminum (Al), or the like is applied as an impurity element of the conductivity type of p⁺-type, p-type, or the like. Moreover, similar effects are obtained when the conductivity types of p-type and n-type are replaced in the semiconductor device 1. Moreover, in all IGBTs disclosed in the embodiments, the p⁺-type collector region 25 may be selectively formed on the collector side, and the n-type buffer layer 22 and the collector electrode 10 may be in contact with each other. Moreover, a p⁻-type region may be selectively formed together with the p⁺-type collector region 25 formed selectively. The IGBT may be of an RC (Reverse Conducting) type in which an n⁺-type drain region is formed together with the p⁺-type collector region 25 and the n⁺-type drain region is in contact with the collector electrode 10. In this case, the n⁺-type drain region functions as a cathode of a diode portion.

The operation of the semiconductor device 1 will be described.

Figure 4A:
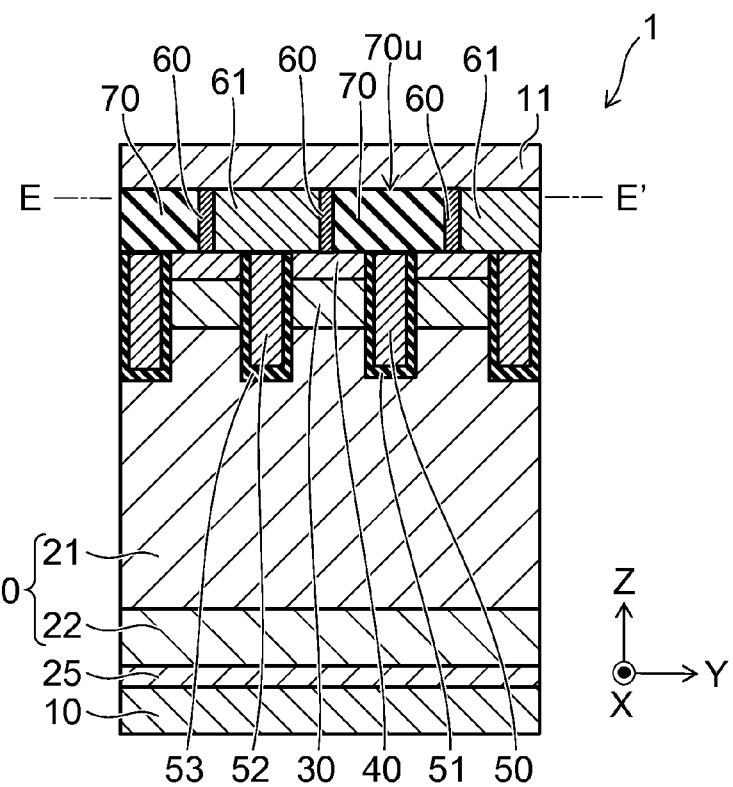
FIG. 4A and FIG. 4B are schematic cross-sectional views showing an operation of the semiconductor device according to the first embodiment.
Figure 4B:
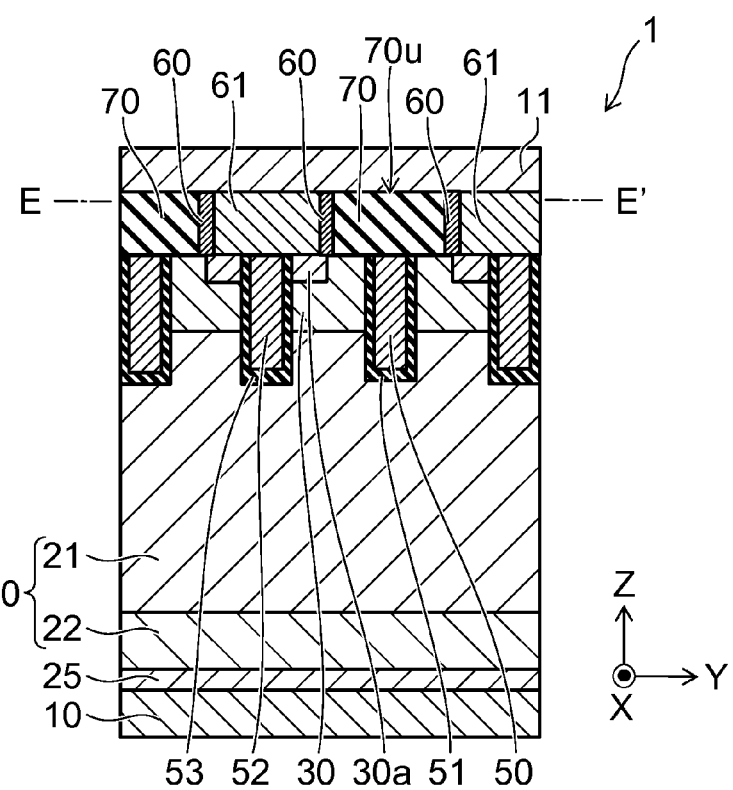

FIG. 4A and FIG. 4B are schematic cross-sectional views showing the operation of the semiconductor device according to the first embodiment.

FIG. 4A corresponds to the schematic cross-sectional view in FIG. 1A; and FIG. 4B corresponds to the schematic cross-sectional view in FIG. 2A.

In an ON state of the semiconductor device 1, an electron current flows through, for example, the emitter electrode 11, the n⁺-type emitter region 40, a channel region formed in the p-type base region 30, the semiconductor region 20, the p⁺-type collector region 25, and the collector electrode 10 in this order. A hole current flows through, for example, the collector electrode 10, the p⁺-type collector region 25, the semiconductor region 20, the p-type base region 30, the p⁺-type region 30a, and the emitter electrode 11 in this order. Here, the p-type base region 30 and the p⁺-type region 30a include regions for ohmic contact with the emitter electrode. The hole current flows into the emitter electrode 11 through the p-type base region 30 and the p⁺-type region 30a.

Effects of the semiconductor device 1 will be described.

When the semiconductor device 1 perform a series of operations such as switching, a current (electron current and hole current) flows between the emitter electrode 11 and the collector electrode 10, and heat corresponding to the loss associated with the series of operations is generated in a semiconductor layer. Alternatively, heat is locally generated due to non-uniformity of a current or the like (so-called current concentration) caused by a non-uniform operation in the semiconductor device 1.

In the semiconductor device 1, the interlayer insulating film 70, which is a thick film, is provided on the p-type base region 30 and on the n⁺-type emitter region 40.

As a reference example, a structure in which the contact region 61 is not present is assumed.

The heat generated in the semiconductor layer is dissipated to the side of the emitter electrode 11. Here, the thermal resistance is determined by the sum of the thermal resistances of the contact region 60 and the interlayer insulating film 70. When the contact region 61 is not present, the volume of the interlayer insulating film 70 with a high thermal resistance relatively increases. That is, the thermal resistance obtained by summing up the thermal resistance of the contact region 60 with a low thermal resistance and the thermal resistance of the interlayer insulating film 70 with the high thermal resistance increases. Therefore, in the reference example, heat dissipation to the emitter electrode 11 side is reduced.

Moreover, a leakage current occurs at a p-n junction portion between the n⁺-type emitter region 40 and the p-type base region 30 during an OFF time, and the temperature rises with the leakage current. The leakage current becomes large as the temperature increases. Hence, when the heat dissipation to the side of the emitter electrode 11 is reduced, the leakage current increases, and the temperature locally rises with the increase in the leakage current. When this falls into a cycle in which the increase in the leakage current and the local temperature rise are repeated, the p-n junction portion between the $n^+$-type emitter region 40 and the p-type base region 30 breaks down. Alternatively, a parasitic npn transistor starts to operate.

The breakdown of the p-n junction portion makes it impossible for the gate electrode 50 to perform OFF control, so that the device cannot be switched off. A device breakdown may occur due to the impossibility of OFF control, or the emitter electrode 11 may melt with an increase in temperature due to an increase in the temperature of the semiconductor device.

In contrast, the semiconductor device 1 includes the contact region 61 in the interlayer insulating film 70 in addition to the contact region 60. Hence, the thermal resistance of the semiconductor device 1 on the emitter side is the thermal resistance obtained by summing up the thermal resistance of the contact region 60, the thermal resistance of the contact region 61, and the thermal resistance of the interlayer insulating film 70.

That is, the volume of the interlayer insulating film 70 with a high thermal resistance relatively decreases due to the presence of the contact region 61 in the semiconductor device 1, so that the thermal resistance obtained by summing up the thermal resistance of the contact region 60 with a low thermal resistance, the thermal resistance of the contact region 61, and the thermal resistance of the interlayer insulating film 70 is low compared to that of the reference example.

Therefore, the heat generated in the semiconductor layer is efficiently dissipated to the side of the emitter electrode 11 in the semiconductor device 1.

For example, even when the leakage current occurs at the p-n junction portion between the $n^+$-type emitter region 40 and the p-type base region 30 during the OFF time, the heat generated at the p-n junction portion between the $n^+$-type emitter region 40 and the p-type base region 30 is efficiently dissipated to the side of the emitter electrode 11 due to the improvement in heat dissipation to the side of the emitter electrode 11.

That is, the cycle in which the increase in the leakage current and the local temperature rise are repeated is less likely to occur in the semiconductor device 1.

Therefore, a short-circuit operation (SCSOA) during the OFF time or a breakdown strength in a high current switching test (RBSOA), which is thought to be a breakdown due to heat, is increased in the semiconductor device 1.

Moreover, the thermal resistance of the contact regions 60 and 61 and the interlayer insulating film 70 can be freely adjusted by adjusting the number of the contact regions 61 in the semiconductor device 1.

Moreover, the electrode 52 is provided in addition to the gate electrode 50 in the semiconductor device 1. That is, in the semiconductor device 1, the electrode 52 is provided at a location where the gate electrode 50 can be placed, and thus the channel density can be adjusted so that a saturation current in the ON state does not become excessive (for example, a saturation current value at a level causing a device breakdown).

Second Embodiment

Figure 5:
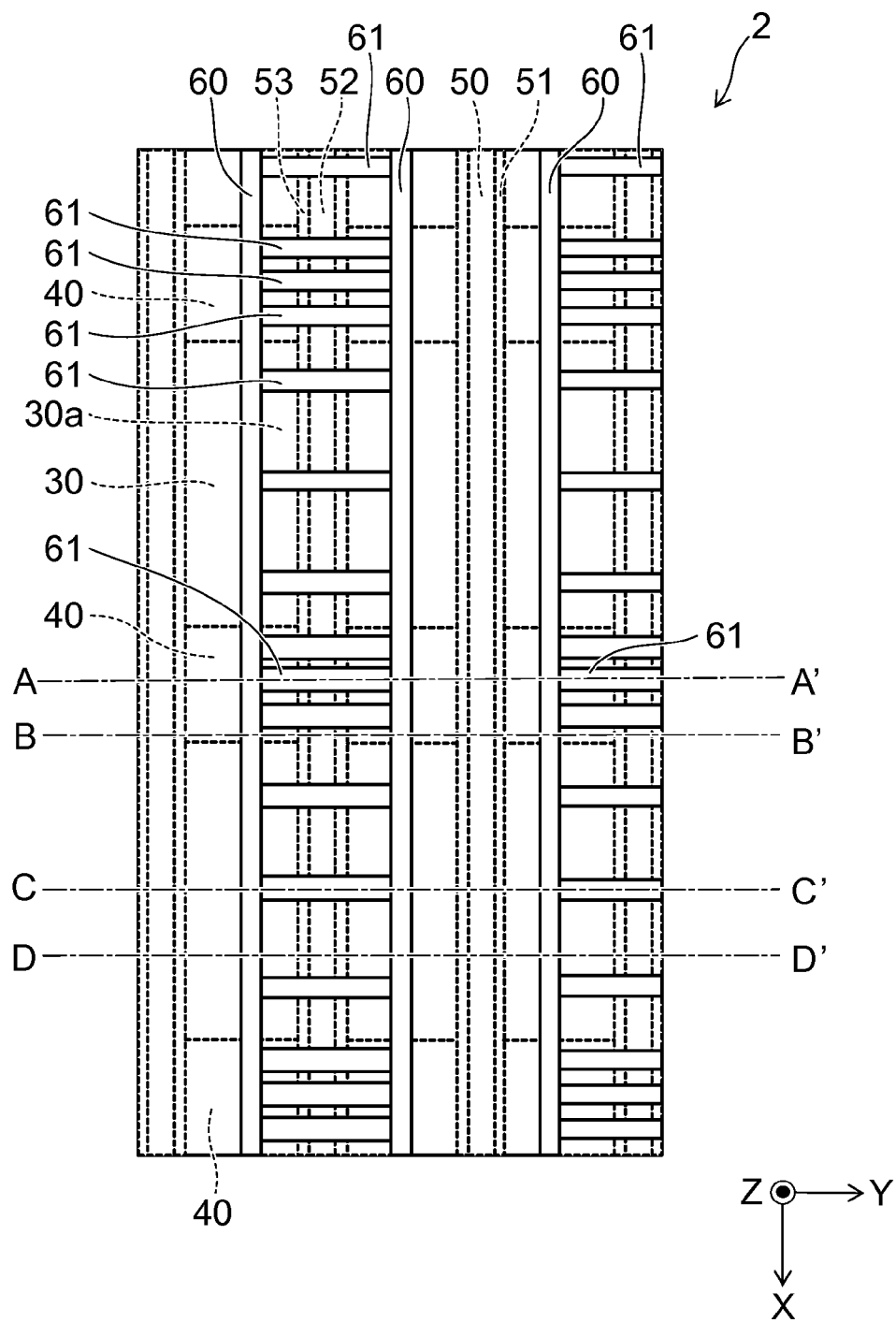
FIG. 5 is a schematic plan view showing a main portion of a semiconductor device according to a second embodiment.

FIG. 5 is a schematic plan view showing a main portion of a semiconductor device according to a second embodiment.

In FIG. 5, an interlayer insulating film 70 is not shown.

In the semiconductor device 2 according to the second embodiment, contact regions 61 are not arranged at equal intervals in the X-direction. For example, the contact regions 61 are concentrated in an $n^+$-type emitter region 40 in the semiconductor device 2.

In other words, in the semiconductor device 2, the occupancy rate of the plurality of contact regions 61 per unit area in a region where a plurality of the $n^+$-type emitter regions 40 are provided is higher than the occupancy rate of the plurality of contact regions 61 in a region where a plurality of p-type base regions 30 are provided.

According to the structure described above, heat dissipation in a junction portion between the $n^+$-type emitter region 40 and the p-type base region 30 is improved more than that of the semiconductor device 1. Due to this, the cycle in which the increase in the leakage current and the local temperature rise are repeated is much less likely to occur in the semiconductor device 2.

Therefore, for example, a short-circuit operation (SC-SOA) during the OFF time or a breakdown strength in a high current switching test (RBSOA), which is thought to be a breakdown due to heat, is increased in the semiconductor device 2.

Third Embodiment

Figure 6A:
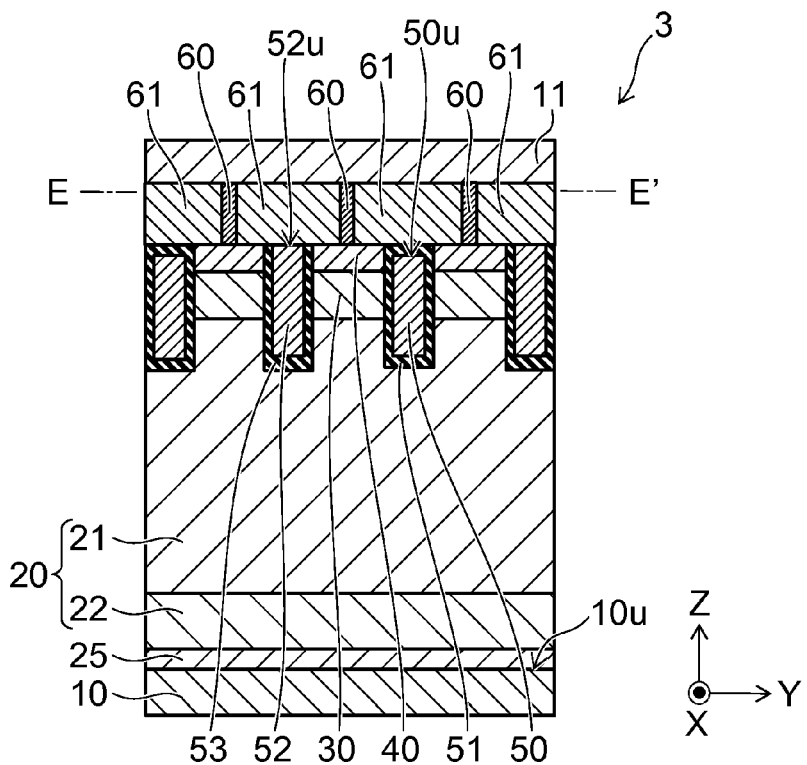
FIG. 6A and FIG. 6B are schematic cross-sectional views showing a main portion of a semiconductor device according to a third embodiment.
Figure 6B:
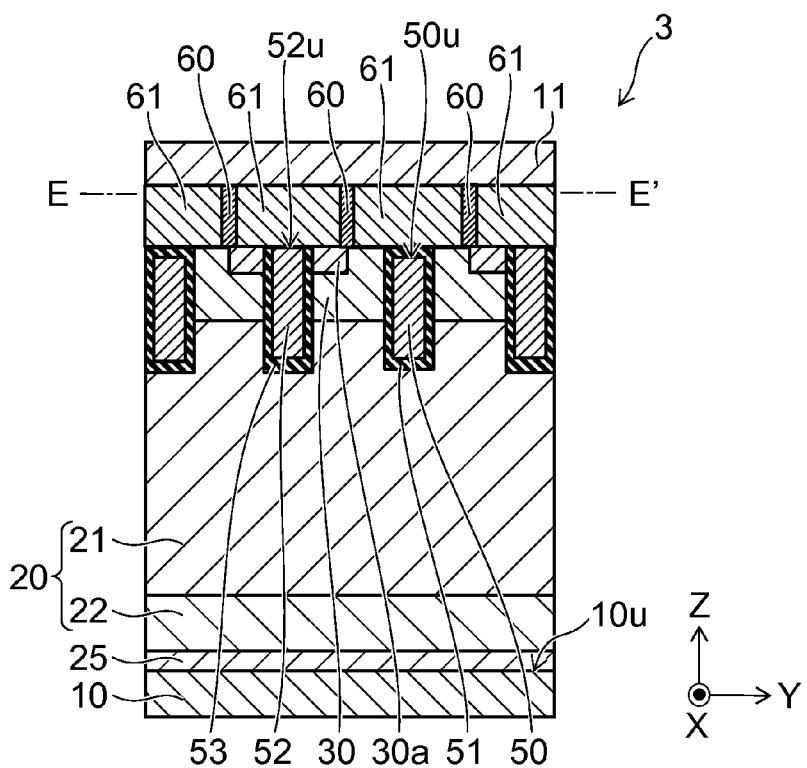

FIG. 6A and FIG. 6B are schematic cross-sectional views each showing a main portion of a semiconductor device according to a third embodiment.

Figure 7:
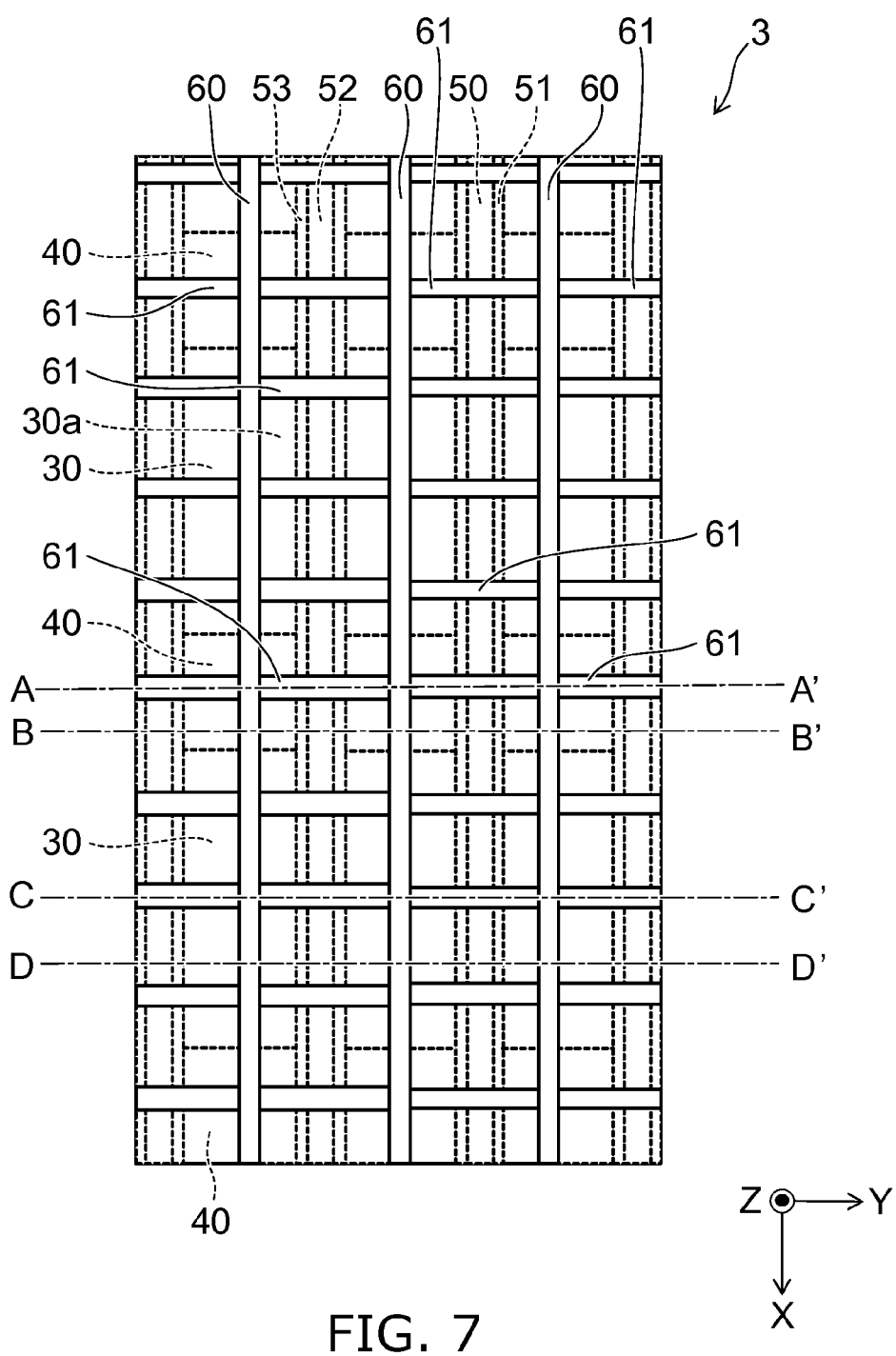
FIG. 7 is a schematic plan view showing a main portion of the semiconductor device according to the third embodiment.

FIG. 7 is a schematic plan view showing a main portion of the semiconductor device according to the third embodiment.

FIG. 6A shows a cross-section along the line A-A' in FIG. 7; and FIG. 6B shows a cross-section along the line C-C' in FIG. 7. A cross-section along the line B-B' in FIG. 7 is the same as that in FIG. 1B; and a cross-section along the line D-D' in FIG. 7 is the same as that in FIG. 2B.

In the semiconductor device 3 according to the third embodiment, a plurality of contact regions 60 and a plurality of contact regions 61 form grid-like contact regions (FIG. 7).

The contact region 61 is provided on a gate electrode 50 via a gate insulating film 51 so that the contact region 61 to be set at the same potential as an emitter electrode 11 is not electrically connected with the gate electrode 50. For example, the gate electrode 50 is opposed to one of the plurality of contact regions 61 via the gate insulating film 51. A distance between an upper end 50u of the gate electrode 50 and an upper surface 10u of a collector electrode 10 is shorter than a distance between an upper end 52u of an electrode 52 and the upper surface 10u of the collector electrode 10. The upper end 50u of the gate electrode 50 is lower than the upper end 52u of the electrode 52.

In the semiconductor device 3, the contact region 61 is provided also on the gate electrode 50. Therefore, heat dissipation is further improved.

Fourth Embodiment

FIG. 8A to FIG. 9B are schematic cross-sectional views each showing a main portion of a semiconductor device according to a fourth embodiment.

Figure 10:
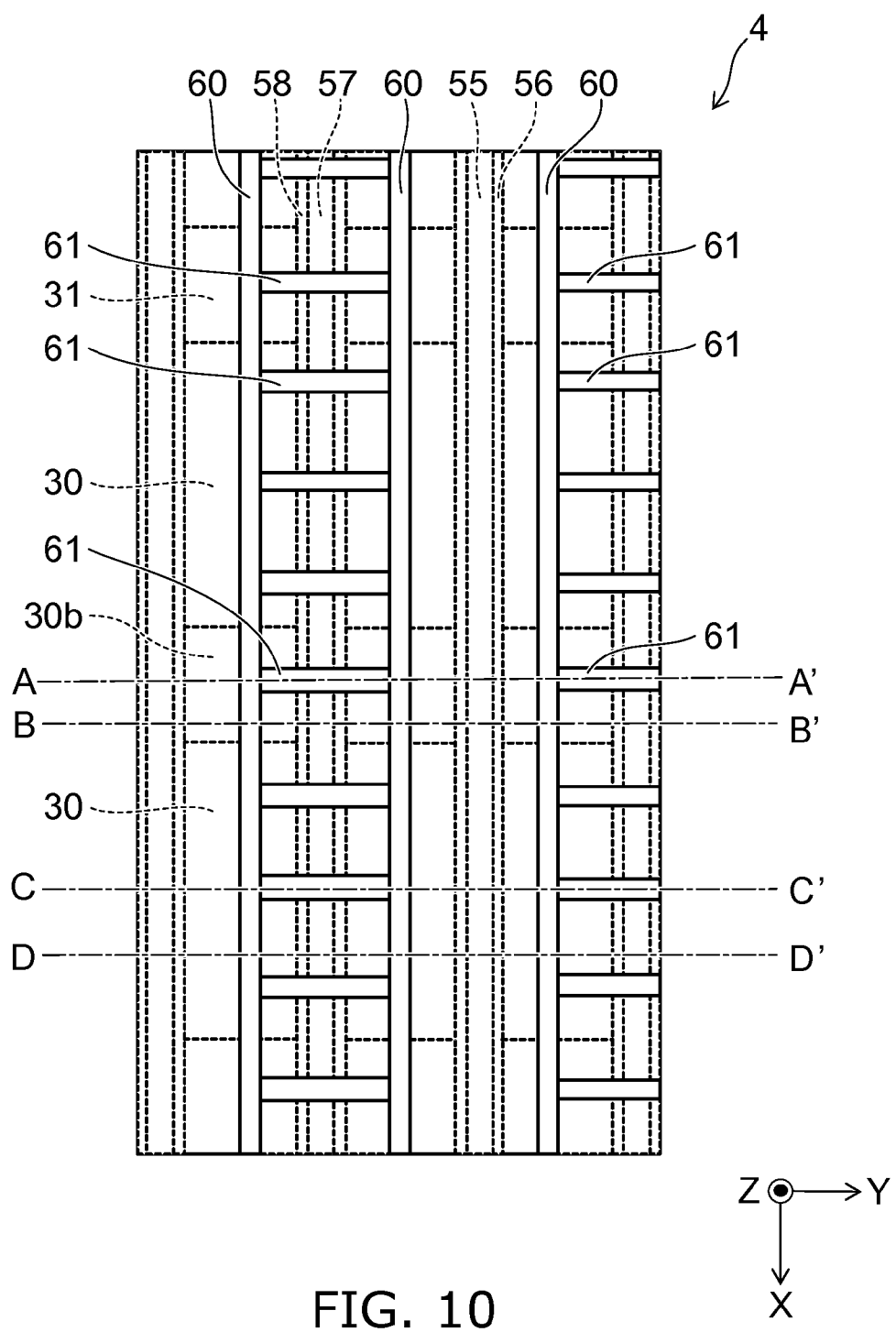
FIG. 10 is a schematic plan view showing a main portion of the semiconductor device according to the fourth embodiment.

FIG. 10 is a schematic plan view showing a main portion of the semiconductor device according to the fourth embodiment.

Figures 9A, 9B:
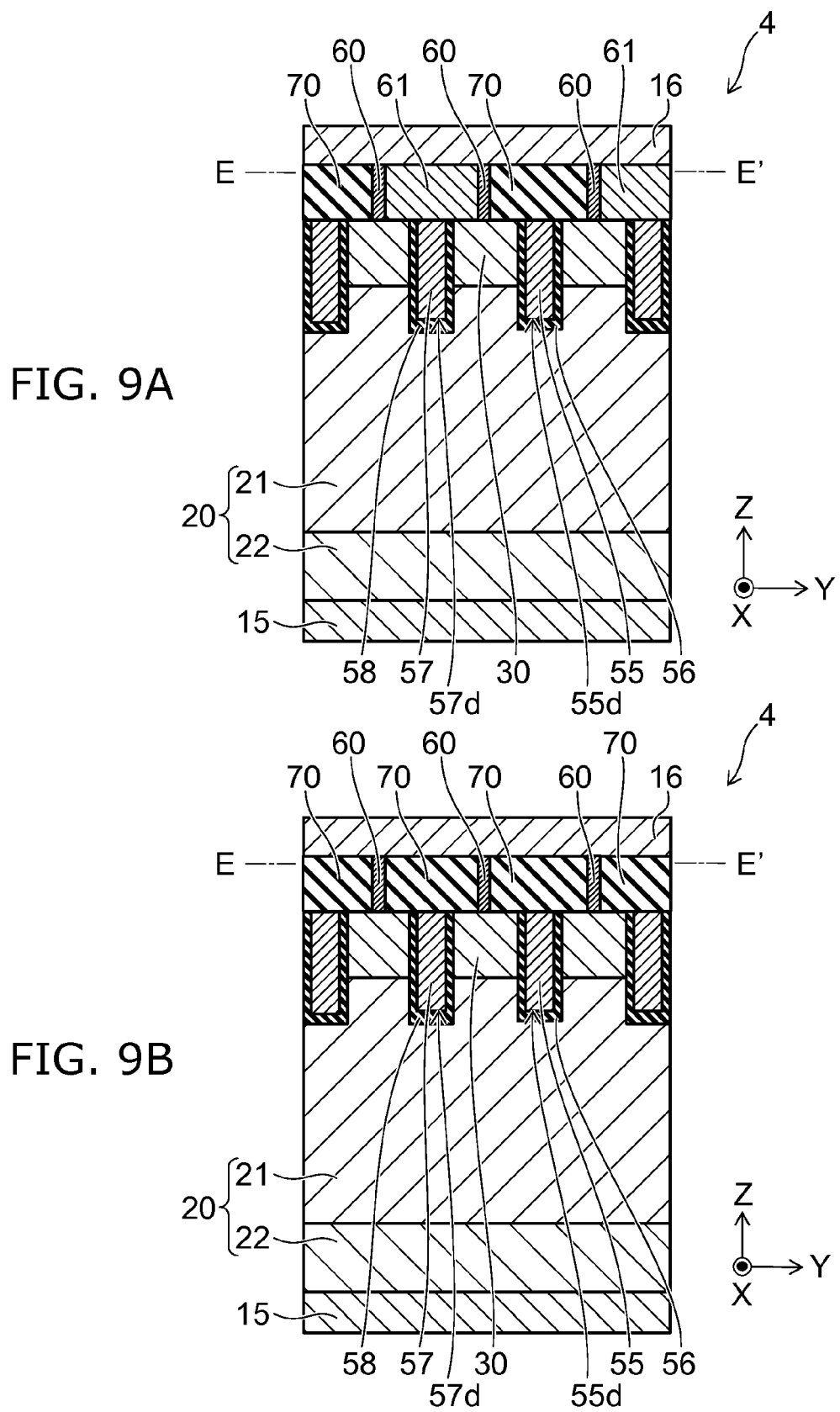

FIG. 8A shows a cross-section along the line A-A' in FIG. 10; FIG. 8B shows a cross-section along the line B-B' in FIG. 10; FIG. 9A shows a cross-section along the line C-C' in FIG. 10; and FIG. 9B shows a cross-section along the line D-D' in FIG. 10.

FIG. 10 shows a plane along the line E-E' in FIG. 8A to FIG. 9B. In FIG. 10, an interlayer insulating film 70 shown in FIG. 8A to FIG. 9B is not shown.

The semiconductor device 4 according to the fourth embodiment is a pin diode having a vertical electrode structure.

In the semiconductor device 4, a plurality of p-type semiconductor regions 30 as anodes are selectively provided on a semiconductor region 20. The semiconductor region 20 includes an $n^-$-type semiconductor region 21 and an n-type semiconductor region 22 as a cathode. A plurality of $p^+$-type regions 30b are selectively provided on the p-type semiconductor regions 30. The plurality of p-type semiconductor regions 30 are arranged in the Y-direction and also arranged in the X-direction. The plurality of regions 30b are arranged in the Y-direction and also arranged in the X-direction. The region 30b can be included in the p-type semiconductor region 30, and the region 30b can be a portion of the p-type semiconductor region 30. In the semiconductor device 4, for example, holes are injected from the $p^+$-type region 30b, and electrons are injected from the n-type semiconductor region 22, in the ON state.

An electrode 55 is provided between adjacent ones of the p-type semiconductor regions 30 in the Y-direction. Moreover, an electrode 57 is provided between adjacent ones of the p-type semiconductor regions 30 in the Y-direction. Moreover, the electrode 55 is provided between adjacent ones of the regions 30b in the Y-direction. Moreover, the electrode 57 is provided between adjacent ones of the regions 30b in the Y-direction. The electrode 55 and the electrode 57 extend in the X-direction.

A lower end 55d of the electrode 55 is located in the $n^-$-type semiconductor region 21. A lower end 57d of the electrode 57 is located in the $n^-$-type semiconductor region 21. An insulating film 56 is provided between the electrode 55 and the $n^-$-type semiconductor region 21. The insulating film 56 is provided between the electrode 55 and the p-type semiconductor region 30. The insulating film 56 is provided between the electrode 55 and the region 30b. An insulating film 58 is provided between the electrode 57 and the $n^-$-type semiconductor region 21. The insulating film 58 is provided between the electrode 57 and the p-type semiconductor region 30. The insulating film 58 is provided between the electrode 57 and the region 30b.

A cathode electrode 15 is provided under the semiconductor region 20 and electrically connected to the n-type semiconductor region 22 in the semiconductor region 20. The cathode electrode 15 is, for example, in ohmic contact with the n-type semiconductor region 22. The interlayer insulating film 70 is provided on the plurality of p-type semiconductor regions 30 and on the plurality of regions 30b. An anode electrode 16 is provided on the interlayer insulating film 70.

The plurality of contact regions 60 electrically connect the p-type semiconductor regions 30 to the anode electrode 16. The plurality of contact regions 60 electrically connect the regions 30b with the anode electrode 16. The plurality of contact regions 60 are in ohmic contact with the regions 30b. The plurality of contact regions 60 pierce the interlayer insulating film 70 in the Z-direction. The plurality of contact regions 60 are in contact with the interlayer insulating film 70. The plurality of contact regions 60 extend in the X-direction.

Adjacent ones of the contact regions 60 in the Y-direction are electrically connected to each other by means of the plurality of contact regions 61. The plurality of contact regions 61 pierce the interlayer insulating film 70 in the Z-direction. The plurality of contact regions 61 are in contact with the anode electrode 16, the interlayer insulating film 70, the p-type semiconductor regions 30, and the regions 30b. The plurality of contact regions 61 are in ohmic contact with the regions 30b. Moreover, the electrode 57 is in contact with the contact region 61. The plurality of contact regions 61 extend in the Y-direction.

Also in the semiconductor device 4, the contact region 61 is provided in addition to the contact region 60. Therefore, heat dissipation is improved in the semiconductor device 4 compared to a semiconductor device in which the contact region 61 is not present. Hence, the cycle in which the increase in the leakage current and the local temperature rise are repeated is less likely to occur in the semiconductor device 4.

When the p-n junction portion thermally breaks down, a current may leak via the p-n junction portion in an OFF state. In the semiconductor device 4, such a leakage current is less likely to occur.

Moreover, the thermal resistance of the contact regions 60 and 61 and the interlayer insulating film 70 can be freely adjusted by adjusting the number of the contact regions 61 in the semiconductor device 4.

Moreover, in the semiconductor device 4, the electrode 55 or the electrode 57 is provided between adjacent ones of the regions 30b in the Y-direction, and the p-type semiconductor region 30 is provided between adjacent ones of the regions 30b in the X-direction.

That is, the occupancy rate of the region 30b is adjusted in the semiconductor device 4 so that the amount of holes injected from the region 30b in the ON state does not become excessive. Therefore, the recovery time or tail time of the semiconductor device 4 after the semiconductor device 4 is turned off is shortened.

Fifth Embodiment

Figure 11:
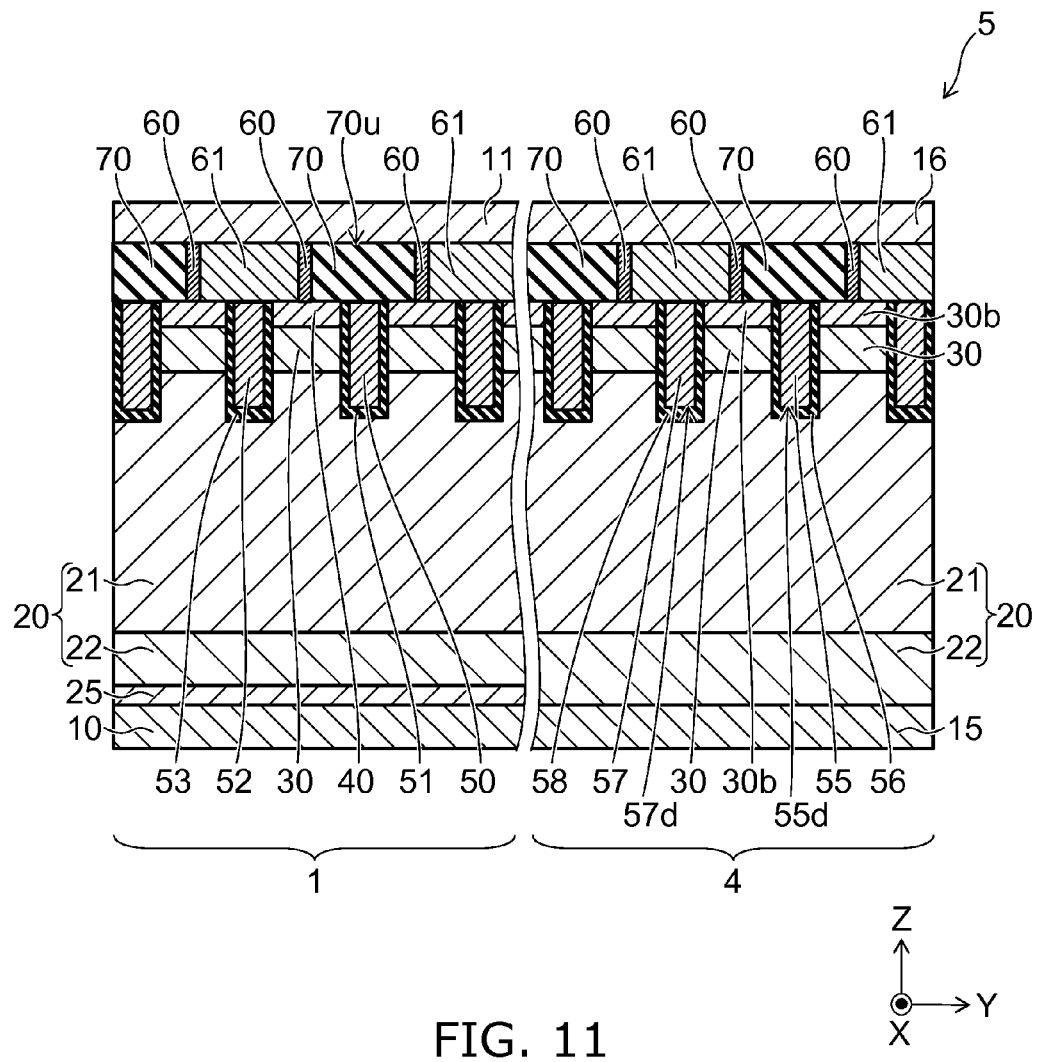
FIG. 11 is a schematic cross-sectional view showing a main portion of a semiconductor device according to a fifth embodiment.

FIG. 11 is a schematic cross-sectional view showing a main portion of a semiconductor device according to a fifth embodiment.

In the semiconductor device 5 according to the fifth embodiment, the semiconductor device 1 and the semiconductor device 4 are combined together. In the semiconductor device 5, a collector electrode 10 and a cathode electrode 15 come to be a common electrode, and an emitter electrode 11 and an anode electrode 16 come to be a common electrode to the semiconductor device 1 and the semiconductor device 4. Semiconductor regions 20 are common semiconductor regions to the semiconductor device 1 and the semiconductor device 4. Moreover, p-type base regions 30 and p-type semiconductor regions 30 are common semiconductor regions to the semiconductor device 1 and the semiconductor device 4. Here, in the p-type semiconductor regions on the semiconductor regions 20, the base region 30 is defined as a first region, and the p-type semiconductor region 30 is defined as a second region. A source region 40 is provided between the base region 30 and the interlayer insulating film 70 in the semiconductor device 5. A plurality of contact regions 60 extend in the Z-direction in the interlayer insulating film 70. One of the plurality of contact regions 60 electrically connect the source region 40 to the emitter electrode 11 in the semiconductor device 1. Moreover, one of the plurality of contact regions 60 electrically connect the p-type semiconductor region 30 to the anode electrode 16 in the semiconductor device 4. A plurality of contact regions 61 extend in the Z-direction in the interlayer insulating film 70. The plurality of contact regions 61 are provided between adjacent ones of the contact regions 60 in the Y-direction.

By combining the semiconductor device 1 and the semiconductor device 4 together, it is possible to provide a semiconductor device including an IGBT and a pin diode, so that the chip size can be reduced or mounting can be facilitated. The semiconductor device 4 functions as a diode. By combining the semiconductor device 1 and the semiconductor device 4 together, the p-type base region 30 and the p-type semiconductor region 30 can be simultaneously formed, the p$^+$-type region 30a and the region 30b can be simultaneously formed, the electrodes 50, 52, 55, and 57 can be simultaneously formed, the contact regions 60 and 61 can be simultaneously formed, the interlayer insulating films 70 can be simultaneously formed, the collector electrode 10 and the cathode electrode 15 can be simultaneously formed, and the emitter electrode 11 and the anode electrode 16 can be simultaneously formed. Therefore, it is possible to achieve a cost reduction in the manufacturing process of the semiconductor device including the IGBT and the pin diode. In the IGBT and the diode, the regions may not be simultaneously formed but may be separately formed.

The semiconductor device to be combined with the semiconductor device 4 is not limited to the semiconductor device 1, but may be the semiconductor device 2 or the semiconductor device 3.

Sixth Embodiment

Figure 12A:
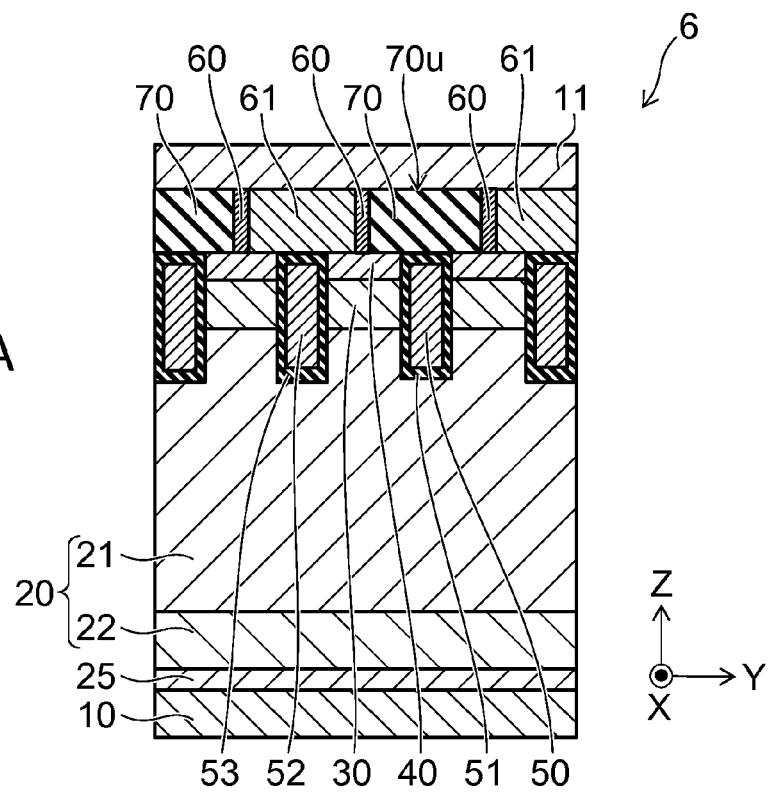
FIG. 12A and FIG. 12B are schematic cross-sectional views showing a main portion of a semiconductor device according to a sixth embodiment.
Figure 12B:
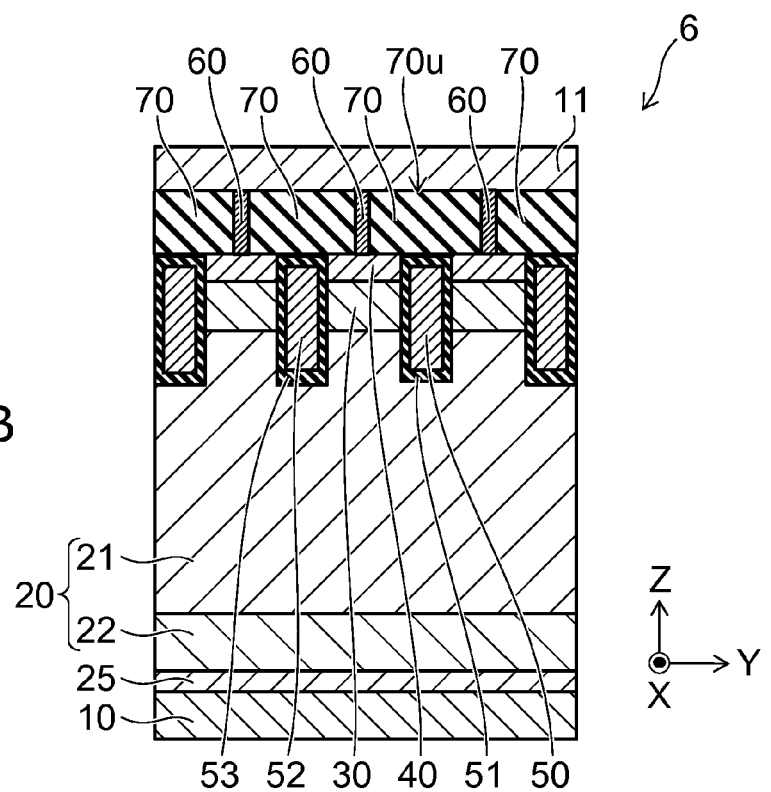

FIG. 12A and FIG. 12B are schematic cross-sectional views showing a main portion of a semiconductor device according to a sixth embodiment.

The gate electrode 50 shown as FIG. 1A-FIG. 2B etc. is directly in contact with the interlayer insulating film 70 and the electrode 52 is directly in contact with the contact region 61.

The semiconductor device 6 illustrated in FIG. 12A and FIG. 12B may have a structure that the gate insulating film 51 is provided between the gate electrode 50 and the interlayer insulating film 70, and the insulating film 53 is provided between the electrode 52 and the contact region 61. This structure has effects same as the semiconductor device 1 etc.

In the embodiments described above, the term "on" in "a portion A is provided on a portion B" may refer to not only the case where the portion A is provided on the portion B such that the portion A is in contact with the portion B but also the case where the portion A is provided above the portion B such that the portion A is not in contact with the portion B. Furthermore, "a portion A is provided on a portion B" may refer to the case where the portion A and the portion B are inverted and the portion A is located below the portion B and the case where the portion A and the portion B are laterally juxtaposed. This is because, even when the semiconductor device according to the embodiment is rotated, the structure of the semiconductor device is not changed by the rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first semiconductor region of a first conductivity type;
   a second semiconductor region of a second conductivity type provided on the first semiconductor region;
   a third semiconductor region of a first conductivity type provided on the second semiconductor region;
   a fourth insulating film provided on the second semiconductor region and on the third semiconductor region;
   a first electrode provided under the first semiconductor region;
   a second electrode provided on the fourth insulating film;
   a plurality of first contact regions extending in a first direction directed from the first electrode toward the second electrode in the fourth insulating film, and the plurality of first contact regions electrically connecting the third semiconductor region to the second electrode;
   a plurality of second contact regions extending in the first direction in the fourth insulating film, and one of the plurality of second contact regions being provided between adjacent ones of the first contact regions; and
   a third electrode provided in the second semiconductor region via a first insulating film.

2. The device according to claim 1, further comprising a fourth electrode provided beside the third electrode, the fourth electrode being provided in the second semiconductor region via a second insulating film, and the fourth electrode electrically being connected to the second electrode through one of the plurality of second contact regions.

3. The device according to claim 2, wherein
   the third electrode and the fourth electrode are alternately arranged in a direction crossing the first direction.

4. The device according to claim 2, wherein
   the fourth electrode is in contact with the plurality of second contact regions.

5. The device according to claim 1, wherein
   the plurality of first contact regions extend in a second direction crossing the first direction.

6. The device according to claim 1, wherein
   one of the plurality of first contact regions is in contact with the second semiconductor region.

7. The device according to claim 1, wherein
   one of the plurality of second contact regions is in contact with the third semiconductor region, the plurality of second contact regions other than the one of the plurality of second contact regions are in contact with the second semiconductor region.

8. The device according to claim 5, wherein
the plurality of second contact regions extend in a third direction crossing the first direction and the second direction.

9. The device according to claim 1, wherein
the plurality of second contact regions are arranged in a second direction crossing the first direction.

10. The device according to claim 1, wherein
the third electrode is opposed to the plurality of second contact regions via the first insulating film.

11. The device according to claim 1, wherein
an occupancy rate of the plurality of second contact regions per unit area in a first region is higher than the occupancy rate in a second region, the third semiconductor region is provided in the first region, and the second semiconductor region is provided in the second region.

12. The device according to claim 1, further comprising a fourth semiconductor region of the second conductivity type between the first semiconductor region and the first electrode.

13. A semiconductor device comprising:
a first semiconductor region of a first conductivity type;
a second semiconductor region of a second conductivity type provided on the first semiconductor region;
a fourth insulating film provided on the second semiconductor region;
a first electrode provided under the first semiconductor region;
a second electrode provided on the fourth insulating film;
a plurality of first contact regions extending in a first direction directed from the first electrode toward the second electrode in the fourth insulating film, and the plurality of first contact regions electrically connecting the second semiconductor region to the second electrode; and
a plurality of second contact regions extending in the first direction in the fourth insulating film, and one of the plurality of second contact regions being provided between adjacent ones of the first contact regions.

14. The device according to claim 13, wherein
the plurality of first contact regions extend in a second direction crossing the first direction.

15. The device according to claim 13, wherein
one of the plurality of first contact regions is in contact with the second semiconductor region.

16. The device according to claim 13, wherein
the plurality of second contact regions extend in a third direction crossing the first direction and the second direction.

17. The device according to claim 13, wherein
the plurality of second contact regions are arranged in a second direction crossing the first direction.

18. The device according to claim 13, further comprising a fifth electrode provided in one of the plurality of second semiconductor regions via a third insulating film.

19. The device according to claim 18, further comprising a sixth electrode provided beside the fifth electrode, provided in one of the plurality of second semiconductor regions via a fourth insulating film, and the sixth electrode electrically being connected to the second electrode through one of the plurality of second contact regions.

20. A semiconductor device comprising:
a first semiconductor region of a first conductivity type;
a second semiconductor region of a second conductivity type provided on the first semiconductor region, and the second semiconductor region including a first region and a second region;
a fourth insulating film provided on the second semiconductor region;
a third semiconductor region provided between the first region of the second semiconductor region and the fourth insulating film;
a first electrode provided under the first semiconductor region;
a second electrode provided on the fourth insulating film;
a plurality of first contact regions extending in a first direction directed from the first electrode toward the second electrode in the fourth insulating film, the plurality of first contact regions electrically connecting the third semiconductor region to the second electrode, and electrically connecting the second region of the second semiconductor region to the second electrode;
a plurality of second contact regions extending in the first direction in the fourth insulating film, and one of the plurality of second contact regions being provided between adjacent ones of the first contact regions; and
a third electrode provided in the first region of the second semiconductor region via a first insulating film.

* * * * *